(12) United States Patent
Kim et al.

(10) Patent No.: US 6,682,975 B2
(45) Date of Patent: Jan. 27, 2004

(54) SEMICONDUCTOR MEMORY DEVICE HAVING SELF-ALIGNED CONTACT AND FABRICATING METHOD THEREOF

(75) Inventors: Myeong-cheol Kim, Suwon (KR); Byeong-yun Nam, Suwon (KR); Sang-sup Jeong, Suwon (KR); Tae-hyuk Ahn, Yongin (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/001,535

(22) Filed: Nov. 13, 2001

(65) Prior Publication Data

US 2002/0055222 A1 May 9, 2002

Related U.S. Application Data

(62) Division of application No. 09/654,664, filed on Sep. 5, 2000, now Pat. No. 6,573,551.

(30) Foreign Application Priority Data

Sep. 2, 1999 (KR) ......................................... 1999-37106
Jun. 20, 2000 (KR) ......................................... 2000-33842

(51) Int. Cl.[7] ......................................... H01L 21/8242
(52) U.S. Cl. ...................... 438/253; 438/306; 438/396
(58) Field of Search ............................... 438/253, 396, 438/FOR 212; 257/306

(56) References Cited

U.S. PATENT DOCUMENTS 5,879,986 A * 3/1999 Sung ........................ 438/253
6,278,152 B1 * 8/2001 Hieda et al. ............... 257/306
6,291,847 B1 * 9/2001 Ohyu et al. ................ 257/300
6,303,430 B1 * 10/2001 Jenq .......................... 438/253
6,316,803 B1 * 11/2001 Ban et al. .................. 257/300
6,333,535 B2 * 12/2001 Okumura ................... 257/306

* cited by examiner

Primary Examiner—George Fourson
Assistant Examiner—Thanh V Pham
(74) Attorney, Agent, or Firm—Marger Johnson & McCollom, P.C.

(57) ABSTRACT

There is provided a method of fabricating a semiconductor memory device having a self-aligned contact, including the steps of forming a plurality of gate electrodes by interposing a gate insulating layer on an active region of a semiconductor substrate in a predetermined direction at constant intervals, forming a first insulating layer on the resultant structure having the gate electrodes and then forming one or more of each of first and second openings which partially open an active region of the semiconductor substrate, forming first and second pad layers by filling the first and second openings with a conductive material, forming a first interlayer dielectric film on the first insulating layer having the first and second pad layers and forming a third opening which opens the surface of the first pad layer, forming a plurality of bit lines in a direction orthogonal to the gate electrodes on the first interlayer dielectric film while filling the third opening, depositing an insulating layer on the resultant structure having the bit lines and removing the insulating layer on the bit lines and on the first interlayer dielectric film to form insulating spacers only at both side walls of the bit lines, forming a second interlayer dielectric film on the resultant structure having the insulating spacers and forming a fourth opening self-aligned to the insulating spacers to open the surface of the second pad layer, and filling the fourth opening with a conductive material.

10 Claims, 15 Drawing Sheets

SEMICONDUCTOR MEMORY DEVICE HAVING SELF-ALIGNED CONTACT AND FABRICATING METHOD THEREOF

This application is a divisional of application Ser. No. 09/654,664, filed Sep. 5, 2000, now U.S. Pat. No. 6,573,551.

BACKGROUND OF THE INVENTION

1. Field of the Invention

The present invention relates to a method of fabricating a semiconductor memory device, and more particularly, to a semiconductor memory device having a self-aligned contact capable of forming a storage node contact in a self-aligned manner, and a fabricating method thereof.

2. Description of the Related Art

In recent years, as semiconductor devices became highly integrated, the cell size occupied by a memory cell per unit area has been sharply reduced. Specifically, the cell size of a dynamic random access memory (DRAM) has been reduced to 1.5 $\mu m^2$ or less. Reduction in the cell size can be attained by reducing the gap between conductive layers constituting a cell. In particular, in DRAMs, due to their high integration, the gap between gate electrodes is continuously reduced to reach a minimum feature size based on a design rule. A contact hole for forming a contact between a bit line and a drain region (to be referred to as a "bit line contact" or "direct contact (DC)" hereinafter), or a contact between a storage electrode and a source region (to be referred to as a "storage node contact" or "buried contact (BC)" hereinafter) is continuously reduced to a minimum feature size.

As semiconductor devices become highly integrated, the distances between a contact hole for connecting a lower interconnection and an upper interconnection and adjacent interconnections decrease and the aspect ratio of the contact hole also increases. Therefore, when a contact hole is formed using a photolithography process in a highly integrated semiconductor device having a multi-layer interconnection structure, there is a limit in realizing a desired process in a reproducible manner. Accordingly, in order to overcome the limit of the photolithography process, a process of forming a contact hole in a self-aligned manner has been developed.

In a capacitor over bit line (COB) structure in which a capacitor is formed after forming a bit line, a storage node contact for connecting a storage electrode of a capacitor and an active region of a semiconductor substrate must be formed between bit lines. In the case where the storage node contact is formed in a contact type, shorts between the storage node contact and the bit lines cannot be avoided in a design rule of 0.2 $\mu m$ or less. In order to prevent shorts between a storage node contact and bit lines, a process of forming a self-aligned contact after capping the bit lines with nitride, which is disclosed in U.S. Pat. No. 5,879,986. According to this method, in a state where bit lines are formed and then a nitride layer is deposited over the entire surface of the resultant structure, the gap between the bit lines is filled with an oxide layer and then a contact hole is formed in a self-aligned manner.

However, according to this method, since a nitride layer for a spacer is further deposited in a state where the gap between bit lines is narrow, voids may occur during filling the gap between bit lines with an oxide layer, that is, a gap-filling capacity is degraded. Also, since the oxide layer between bit lines is formed over the nitride layer, the overall thickness of the nitride and oxide layers is greater than the narrow gap between bit lines, that is, the aspect ratio increases, thereby disabling formation of a self-aligned contact hole. Further, during an etching process for forming a self-aligned contact, after the oxide layer is etched and the nitride is then etched, an oxide layer under the bit lines should be additionally etched.

SUMMARY OF THE INVENTION

To solve the above problems, it is an object of the present invention to provide a highly integrated semiconductor memory device capable of easily filling the gap between bit lines and having a self-aligned contact between the bit lines. It is another object of the present invention to provide a method of fabricating a semiconductor memory device capable of easily filling the gap between bit lines and having a self-aligned contact between the bit lines.

Accordingly, to achieve the first object, there is provided a semiconductor memory device having a self aligned contact including a plurality of gate electrodes which are formed on a semiconductor substrate in a predetermined direction at constant intervals, a first insulating layer which is formed on the resultant structure having the gate electrodes and which has one or more of each of first and second openings which partially open an active region of the semiconductor substrate, first and second conductive pad layers which fill the first and second openings, a first interlayer dielectric film formed on the first insulating layer having the first and second pad layers, a plurality of bit lines which are orthogonal to the gate electrodes on the first interlayer dielectric film and are electrically connected to the first pad layer through the first interlayer dielectric film, insulating spacers formed at both side walls of the bit lines, a second interlayer dielectric film which is formed on the first interlayer dielectric film having the bit lines and the insulating spacers, and a storage electrode of a semiconductor capacitor, which is self-aligned to the insulating spacers between the bit lines and electrically connected to the second pad layer through the second interlayer dielectric film and the first interlayer dielectric film.

Preferably, a mask layer and insulating spacer are further formed on the gate electrode and at side walls thereof, respectively, and the first and second pad layers are self-aligned to the spacers. Also, the top surface levels of the first and second pad layers are as high as or lower than the top surface level of the mask layer on the gate electrode.

Also, the mask layer may be formed of a silicon nitride (SiN) layer based on plasma enhanced chemical vapor deposition (PECVD) or a thermal SiN layer and the insulating spacer formed at side walls of the bit line may be formed of a SiN layer based on low pressure chemical vapor deposition (LPCVD).

Preferably, the first and second interlayer dielectric films are formed of silicon oxide, and the insulating spacer formed at side walls of the bit line are formed of silicon nitride.

To achieve the second object, there is provided a method of fabricating a semiconductor memory device having a self-aligned contact, including the steps of forming a plurality of gate electrodes by interposing a gate insulating layer on an active region of a semiconductor substrate in a predetermined direction at constant intervals, forming a first insulating layer on the resultant structure having the gate electrodes and then forming one or more of each of first and second openings which partially open an active region of the semiconductor substrate, forming first and second pad layers by filling the first and second openings with a conductive material, forming a first interlayer dielectric film on the first insulating layer having the first and second pad layers and forming a third opening which opens the surface of the first pad layer, forming a plurality of bit lines in a direction orthogonal to the gate electrodes on the first interlayer dielectric film while filling the third opening, depositing an insulating layer on the resultant structure having the bit lines and removing the insulating layer on the bit lines and on the first interlayer dielectric film to form insulating spacers only at both side walls of the bit lines, forming a second interlayer dielectric film on the resultant structure having the insulating spacers and forming a fourth opening self-aligned to the insulating spacers to open the surface of the second pad layer, and filling the fourth opening with a conductive material.

The step of forming the bit lines preferably includes the sub-steps of forming a conductive layer on the first interlayer dielectric film while filling the third opening, forming a mask layer on the conductive layer and sequentially patterning the mask layer and the conductive layer.

The mask layer is preferably formed of a silicon nitride (SiN) layer based on plasma enhanced chemical vapor deposition (PECVD) or a thermal SiN layer. The first and second interlayer dielectric films are preferably formed of silicon oxide, and the insulating spacer formed at both side walls of the bit line are formed of silicon nitride.

Also, the fourth opening is preferably etched using a mixed gas of $C_4F_8$, $O_2$ and Ar as an etching gas.

According to the present invention, when forming an opening for a storage node contact by anisotropically etching the second interlayer dielectric film and the first interlayer dielectric film, the opening can be formed to be self-aligned to the spacer formed at the side walls of the bit line. Also, since the gap between bit lines is wider than that in the conventional art, it is easy to fill the gap with the second interlayer dielectric film. Further, when forming an opening for a storage node contact, since the first interlayer dielectric film is continuously removed after etching the second interlayer dielectric film, the fabrication process can be simplified.

BRIEF DESCRIPTION OF THE DRAWINGS

The above objects and advantages of the present invention will become more apparent by describing in detail a preferred embodiment thereof with reference to the attached drawings in which:

FIGS. 3A through 9C are diagrams illustrating successive steps of a method for fabricating a semiconductor memory device according to the present invention, in which the "A" drawings are plan views of the semiconductor memory device, and the "B" "C" and "D" drawings are cross-section views thereof, taken along B–B', C–C' and D–D' directions, respectively, in which

DESCRIPTION OF THE PREFERRED EMBODIMENTS

Figure 1:
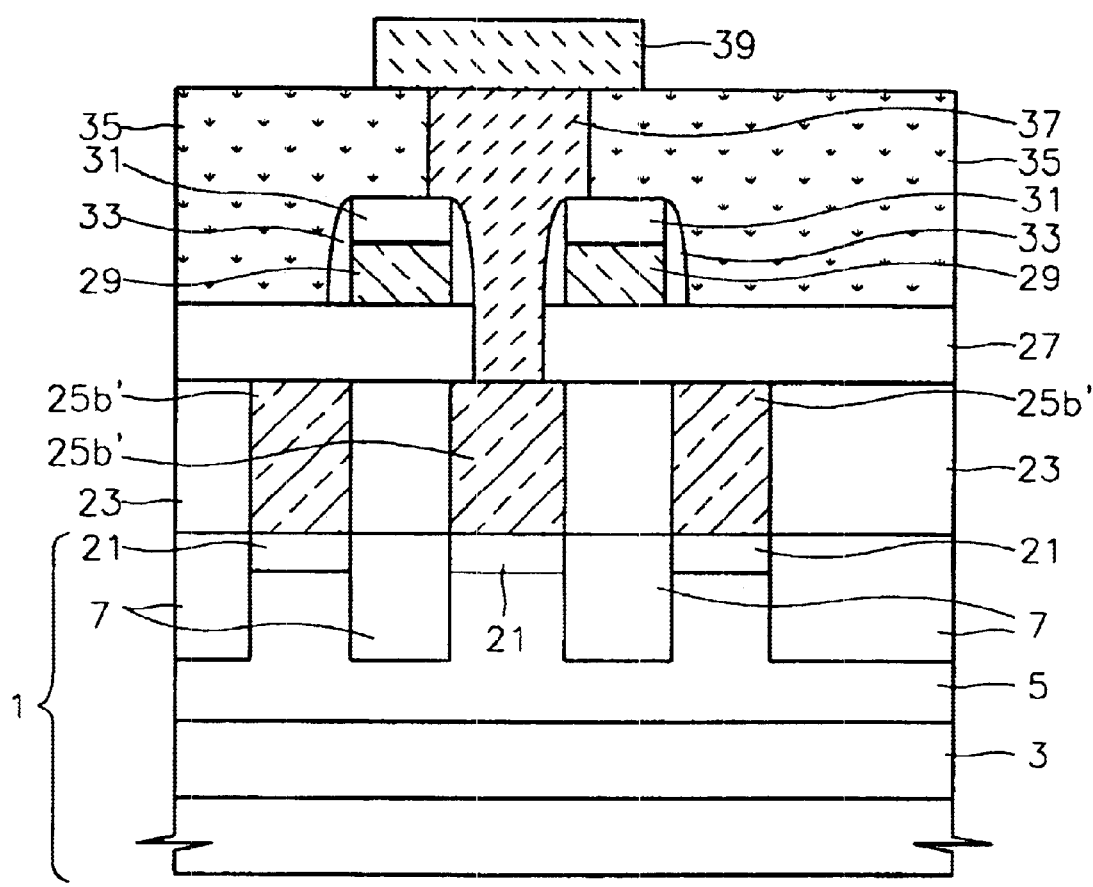
FIG. 1 is a cross-sectional view illustrating a semiconductor memory device according to a preferred embodiment of the present invention, in a word-line direction.

The present invention is not limited to the following embodiments and is implemented in various forms. These embodiments are provided only for perfecting the disclosure of the invention and making the scope of the invention known to those who have ordinary skills in the art. Throughout the drawings, thicknesses of various layers and areas are emphasized for clarity. In the drawings, the same elements are designed by the same numbers. Also, when a layer is said to exist on another layer or a substrate, the layer may exist directly on the other layer or substrate, an interlayer film may be present therebetween.

Figure 2:
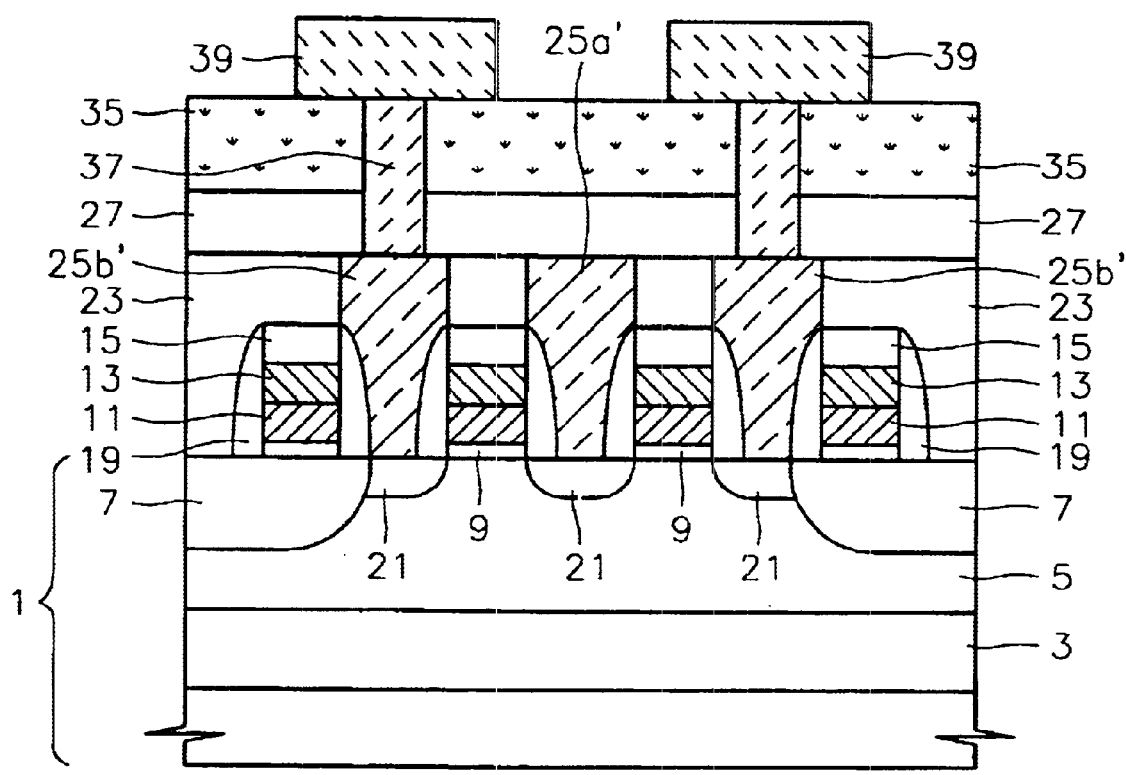
FIG. 2 is a cross-sectional view illustrating a semiconductor memory device according to a preferred embodiment of the present invention, in a bit-line direction.

FIGS. 1 and 2 are cross-sectional views of a semiconductor memory device according to a preferred embodiment of the present invention, in a word-line direction and a bit-line direction, respectively.

Referring to FIGS. 1 and 2, a buried impurity layer 3 of a second conductivity type, e.g., an N type, and a P-type well 5 for forming an NMOS transistor are sequentially formed in a surface region 1 of a semiconductor substrate 1 of a first conductivity type, e.g., a P type. An isolation region 7 for isolating active regions is formed within the P-type well 5.

A plurality of gate electrodes constituting word lines are formed on the semiconductor substrate having the P-type well 5, with an gate insulating layer 9 interposed therebetween. Each of the gate electrodes includes a doped polysilicon layer 11 and a silicide layer 13 and a mask layer 15 made of nitride is formed on the silicide layer 13. A spacer 19 made of a silicon nitride layer based on a low pressure chemical vapor deposition (LPCVD) is formed at side walls of the gate electrode pattern composed of the gate electrode 11+13 and the mask layer 15.

A first insulating layer 23 is formed to cover the resultant structure having the gate electrode and spacer. In the first insulating layer 23, a first pad layer 25a' and a second pad layer 25b' filled with conductive materials are formed at a first opening and a second opening which are self-aligned to the spacer 19 formed at the side walls of the gate electrode pattern, and a first pad layer 25a' and the second pad layer 25b' are electrically connected to the N-type impurity layer 21 constituting a source region or a drain region formed in the active region within the P-type well 5, respectively.

A first interlayer dielectric film 27 is formed over the first insulating layer 23 having the first pad layer 25a' and the second pad layer 25b', and a bit line 29 electrically connected to the first pad layer 25a' is formed to be orthogonal to the gate electrode pattern functioning as a word line via a third opening (not shown) formed in the first interlayer dielectric film 27.

Otherwise, the bit line 29 may be formed so as to be directly connected to the N-type impurity layer 21, that is, the active region of the semiconductor substrate, without previously forming the first pad layer 25a'. The bit line 29 may be formed of tungsten, titanium or a stacked structure of tungsten and titanium nitride. A mask layer 31 made of a silicon nitride layer (SiN) formed by plasma enhanced chemical vapor deposition (PECVD) or a thermal SiN, is formed on the bit line 29.

In particular, a spacer 33 made of an insulating layer having an excellent etching selectivity with respect to a silicon oxide layer forming an insulating layer, e.g., a LPCVD silicon nitride layer, is formed at side walls of a bit line pattern composed of the bit line 29 and the mask layer 31.

A second interlayer dielectric film 35 is formed to cover the resultant structure having the spacer 33. A fourth opening which is self-aligned to the spacer 33 at the side walls of the bit line 29 and which partially opens the second pad layer 25b' is formed in the second interlayer dielectric film 35. A storage node contact 37 made of a conductive material is filled within the fourth opening, and a storage electrode 39 which contacts the storage node contact 37 is formed on the second interlayer dielectric film 35. Otherwise, the storage node contact 37 or the storage electrode 39 may be directly connected to the N-type impurity layer formed in the active region of the semiconductor substrate, without previously forming the second pad layer 25b'.

Figure 10:
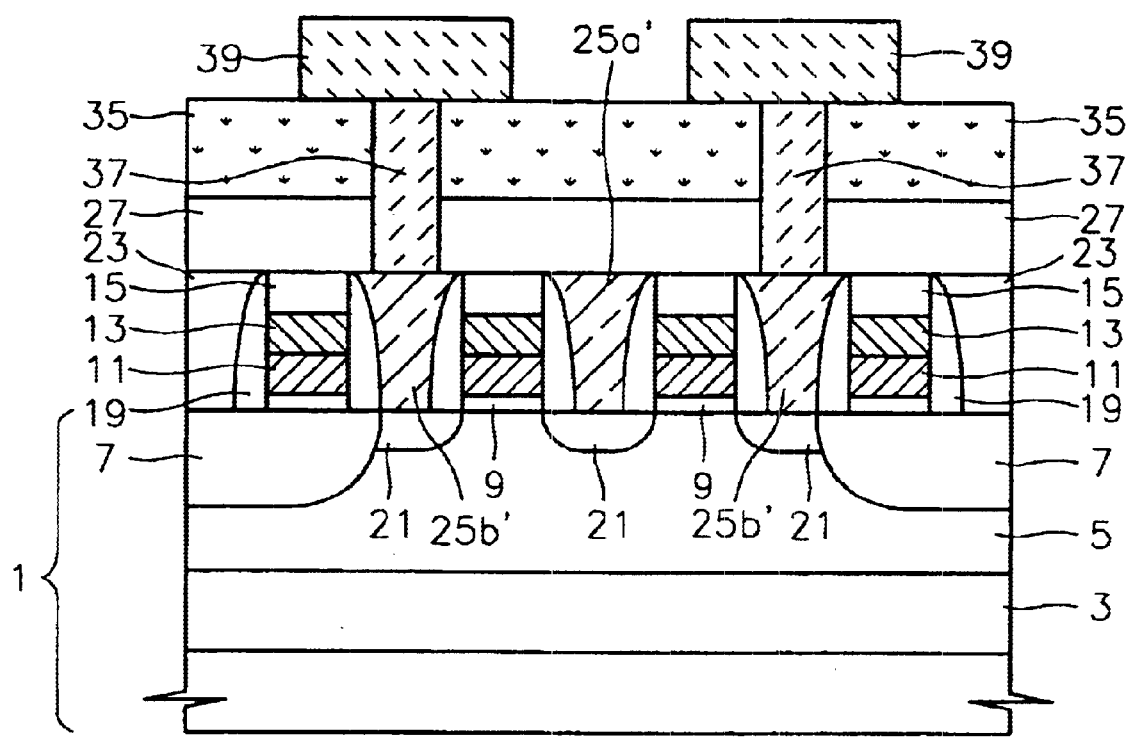
FIG. 10 is a cross sectional view of a semiconductor memory device according to another embodiment of the present invention, taken along a bit line direction.

FIG. 10 is a cross-sectional view of a semiconductor memory device according to another embodiment of the present invention, taken along the same word line direction as in FIG. 2. The semiconductor memory device of FIG. 10 is the same as that of FIG. 2, except that the top level of the first insulating layer 23 is as high as or lower than that of the mask layer 15 present on the gate electrode 11/13.

The isolation region 7 is formed as follows. An oxide layer for a buffer, (not shown), and a nitride layer for a mask, (not shown), are sequentially formed on the semiconductor substrate 1 to then define field regions using a photolithography process, and then the nitride layer for a mask and the oxide layer for a buffer are anisotropically etched in sequence. Then, the opened semiconductor substrate 1 is anisotropically etched to a depth of 3,000 to 5,000 Å to form a trench. An oxide layer is deposited over the entire surface of the semiconductor substrate having the trench to a thickness greater than the depth of the trench using a chemical vapor deposition (CVD) method, an etch-back process or a chemical mechanical polishing (CMP) process is performed, and the oxide layer for a buffer and the nitride layer for a mask are then removed.

Figure 3A:
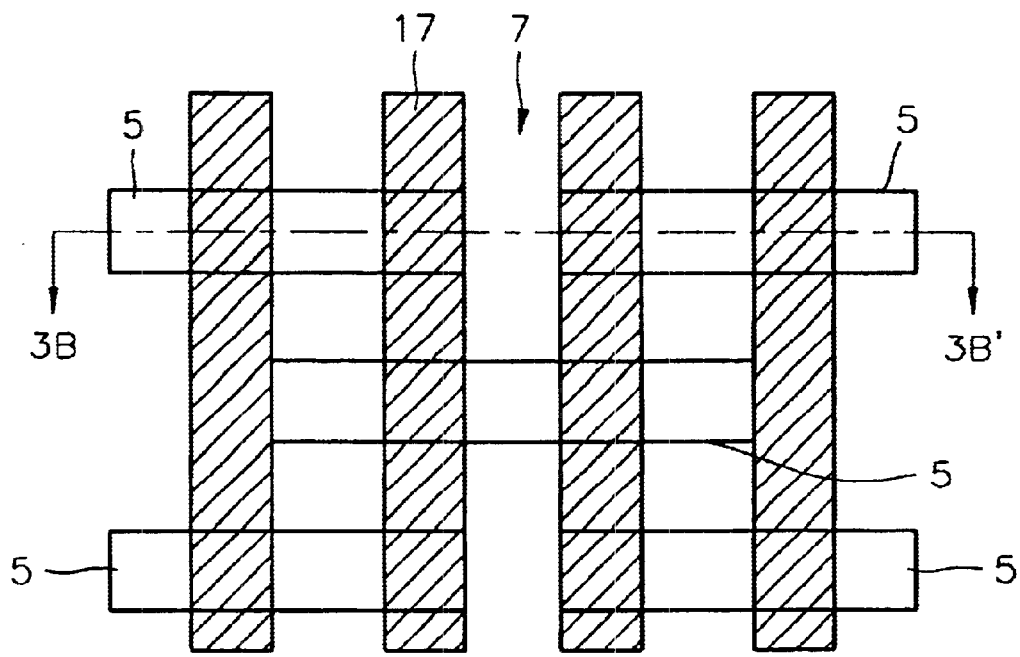
Figure 3B:
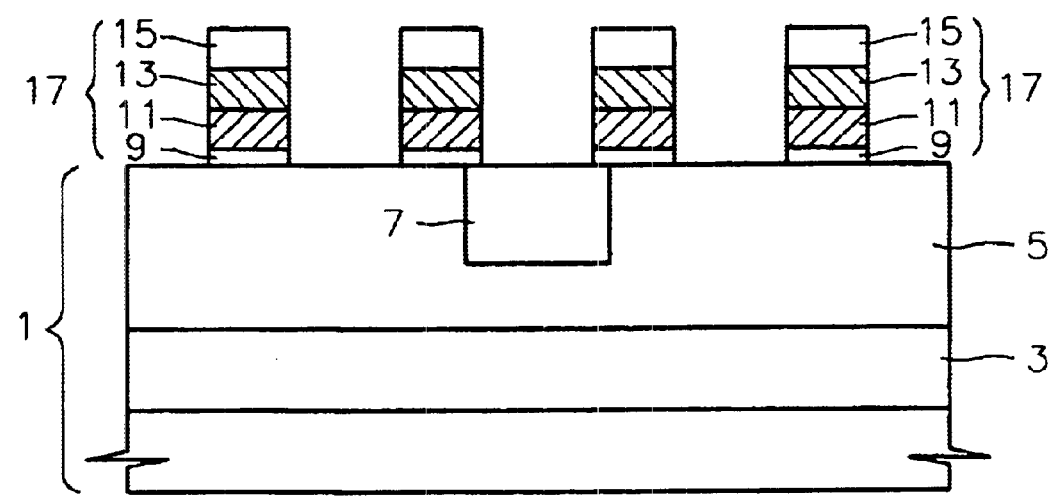

Referring to FIGS. 3A and 3B, a buried impurity layer 3 of a second conductivity type, e.g., an N type, and a P-type well 5 for forming an NMOS transistor are sequentially formed on a semiconductor substrate 1 of a first conductivity type, e.g., a P type, by a conventional method, e.g., an ion implantation method. Next, a trench type isolation region 7 is formed within the P-type well 5 by a conventional isolation process.

The isolation region 7 is formed as follows. An oxide layer for a buffer, (not shown), and a nitride layer for a mask, (not shown), are sequentially formed on the semiconductor substrate 1 to then define field regions using a photolithography process, and then the nitride layer for a mask and the oxide layer for a buffer are anisotropically etched in sequence. Then, the opened semiconductor substrate 1 is anisotropically etched to a depth of 3,000 to 5,000 (Å) to form a trench. An oxide layer is deposited over the entire surface 1 of the semiconductor substrate having the trench to a thickness greater than the depth of the trench using a chemical vapor deposition (CVD) method, an etch-back process or a chemical mechanical polishing (CMP) process is performed, and the oxide layer for a buffer and the nitride layer for a mask are then removed.

Subsequently, a predetermined insulating layer such as an oxide layer or a nitride layer is deposited on the semiconductor substrate 1 having the isolation region 7 to form a gate insulating layer 9. Next, a doped polysilicon layer 11 and a silicide layer 13 are sequentially formed on the gate insulating layer 9 by a conventional manner, and then a mask layer 15 made of silicon nitride is deposited thereon using a PECVD method.

Then, photoresist (not shown) is coated over the mask layer 15 and then a predetermined photolithography process is performed to form a photoresist pattern corresponding to a gate electrode pattern formed in a subsequent step. The mask layer 15 is anisotropically etched using the photoresist pattern as an etching mask to then remove the photoresist pattern. The silicide layer 13 and the polysilicon layer 11 are anisotropically etched in sequence using the patterned mask layer 15 as an etching mask, thereby forming the gate electrode pattern 17.

Figure 4A:
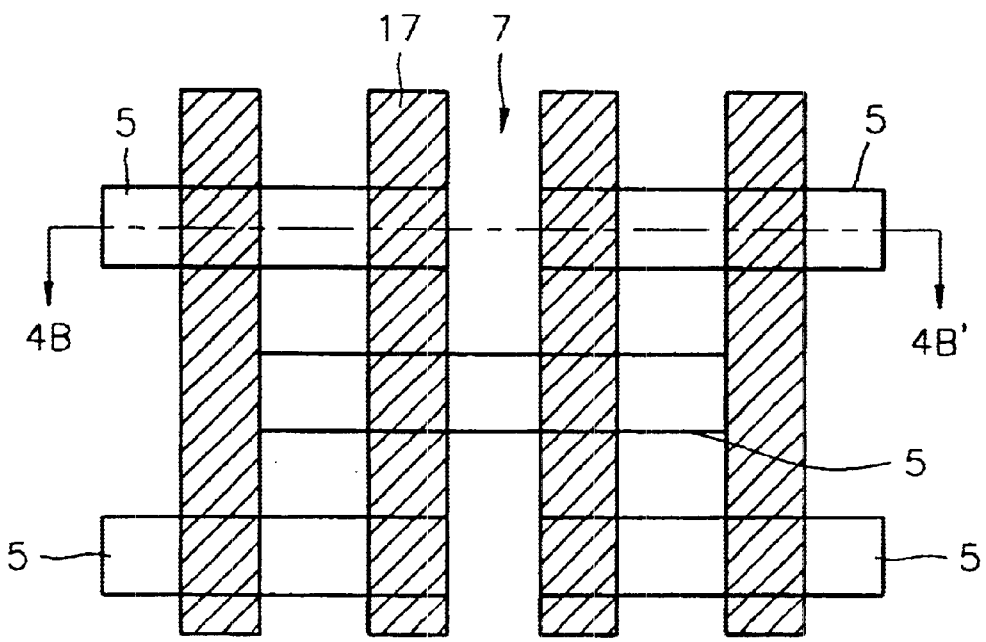
Figure 4B:
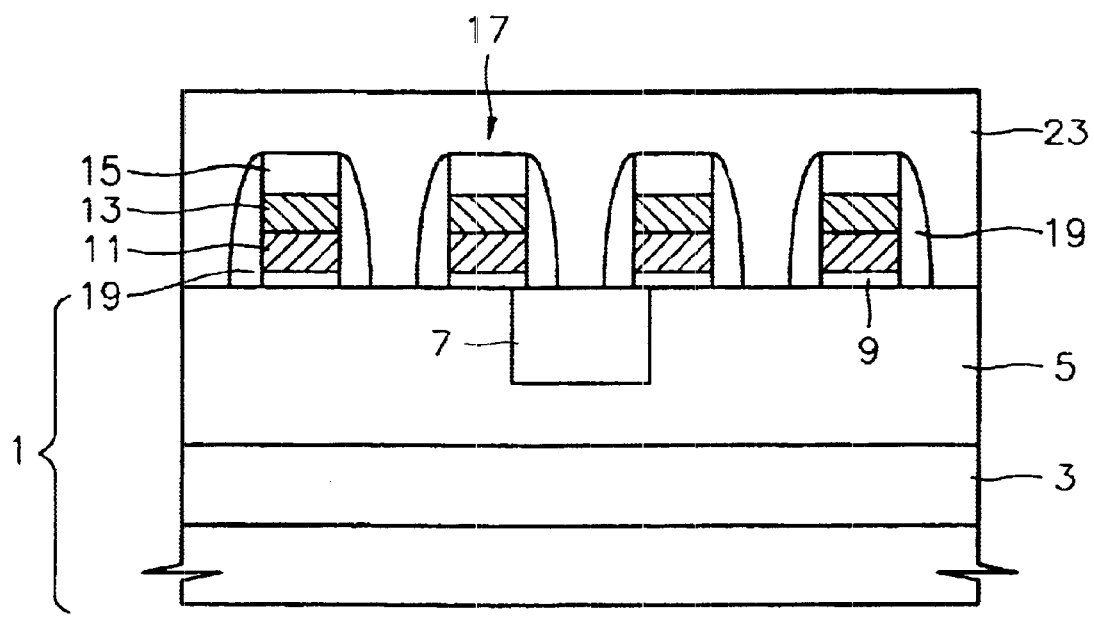

FIG. 4A is a plan view illustrating the step of forming a first insulating layer and FIG. 4B is a cross-sectional view of the plan view shown in FIG. 4A, taken along a 4B–4B' direction.

In detail, a nitride layer is deposited on the resultant structure having the gate electrode pattern 17 to a predetermined thickness by a PECVD or LPCVD method and then blanket-etched to form a nitride spacer 19 at side walls of the gate electrode pattern 17. The nitride spacer 19 serves as an etching barrier for forming a contact in a self-aligned manner by preventing the side walls of a gate electrode from being etched when forming an opening for opening the active region of the semiconductor substrate 1 during a subsequent process. Next, an insulating layer of 5,000 to 8,000 Å, e.g., a borophosphosilicate glass (BPSG) layer, is deposited by a conventional CVD method to form a first insulating layer 23 covering the resultant structure having the mask layer 15 and the spacer 19. Next, a conventional planarization process such as a CMP process is performed to planarize the surface of the insulating layer 23.

Figure 5A:
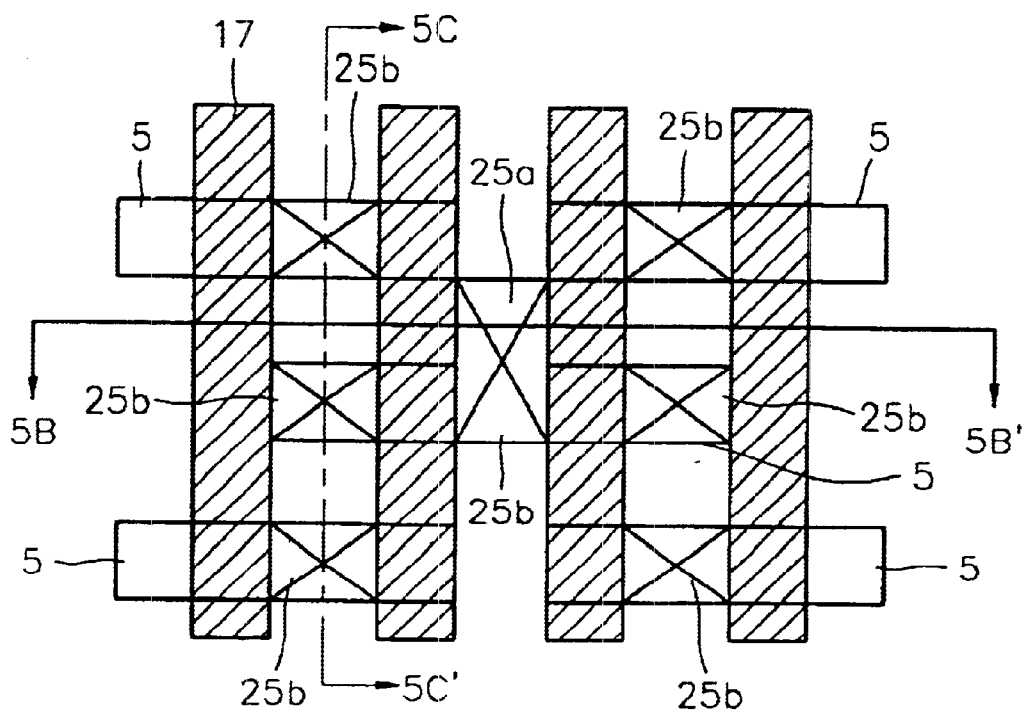
Figure 5B:
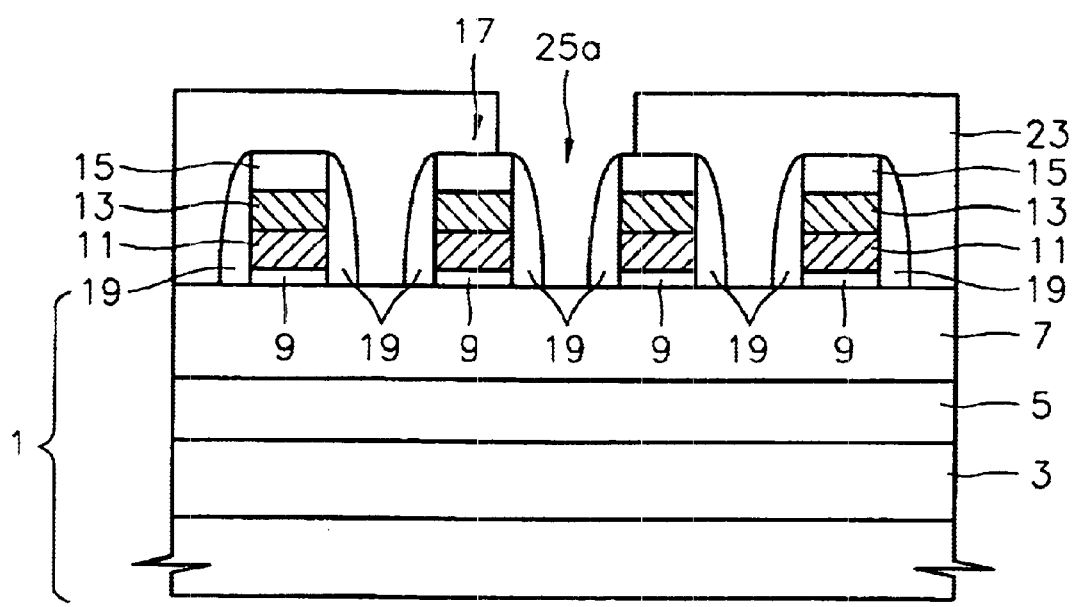
Figure 5C:
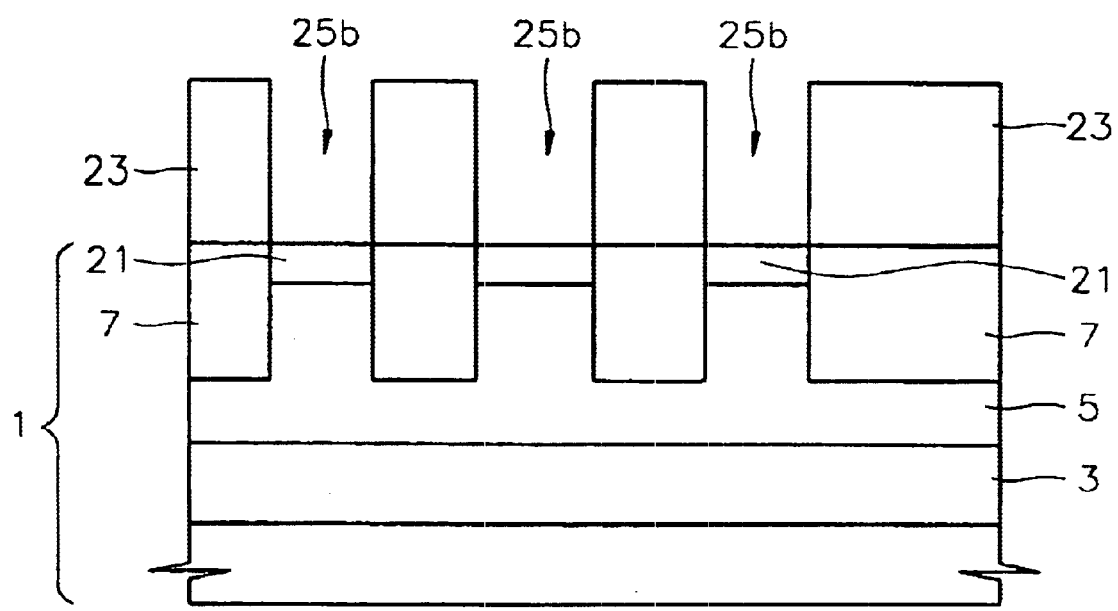

FIG. 5A is a plan view illustrating the step of forming a self-aligned contact hole, and FIGS. 5A and 5C are cross-sectional views of FIG. 5A, taken along 5B–5B' and 5C–5C' directions.

In detail, a predetermined photolithography process is performed to partially etch the first insulating layer 23, thereby forming a first opening 25a and a second opening 25b which open the P-type well 5 which is the active region of the semiconductor substrate 1. As shown in opening patterns indicated by "X" in FIG. 5A, the first opening 25a opens both the P-type well 5 and the isolation region 7, while the second opening 25b opens only the P-type well 5 which is the active region of the semiconductor substrate 1.

The first opening 25a and the second opening 25b are self-aligned to the spacer 19 formed at the side walls of the gate electrode pattern 17, and are formed for the purpose of forming a pad layer for being electrically connected to a bit line to be formed during a subsequent step or to a storage node for forming a storage electrode of a capacitor.

Then, as shown in FIG. 5C, N-type impurity ions are implanted into the entire surface of the resultant structure having the first and second openings 25a and 25b, thereby forming N-type impurity layer 21 in the active region of the semiconductor substrate 1 opened by the first and second openings 25a and 25b.

Figure 6A:
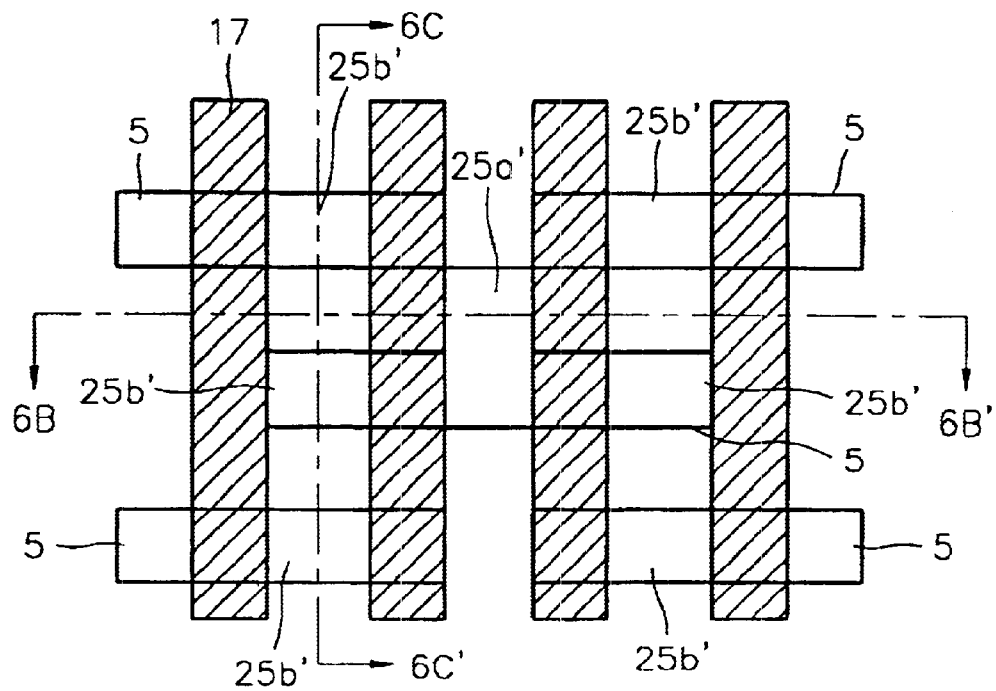
Figure 6B:
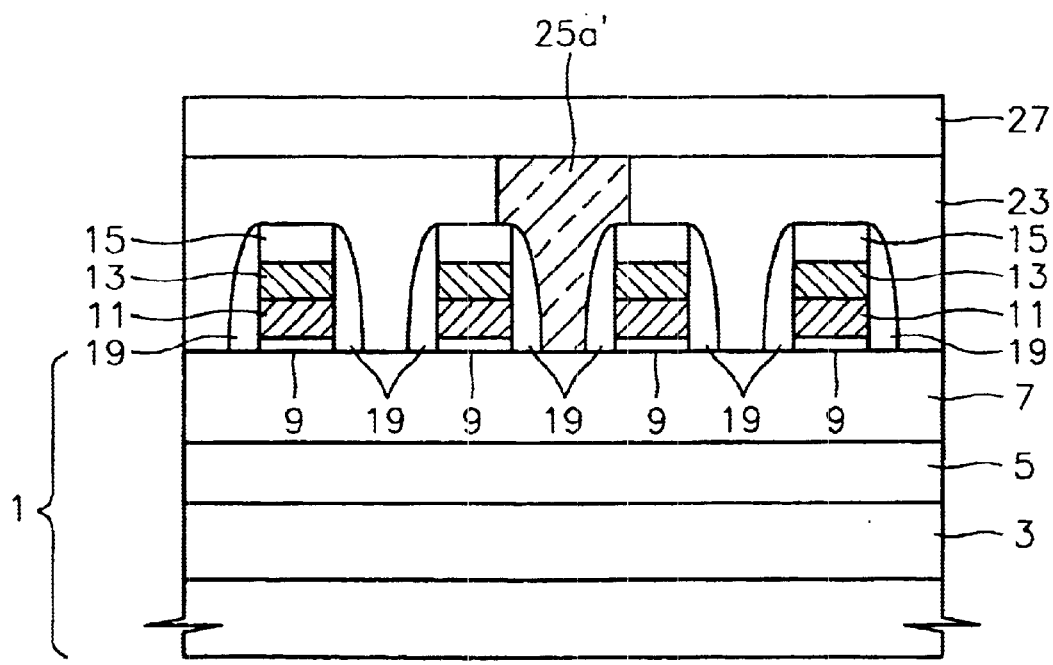
Figure 6C:
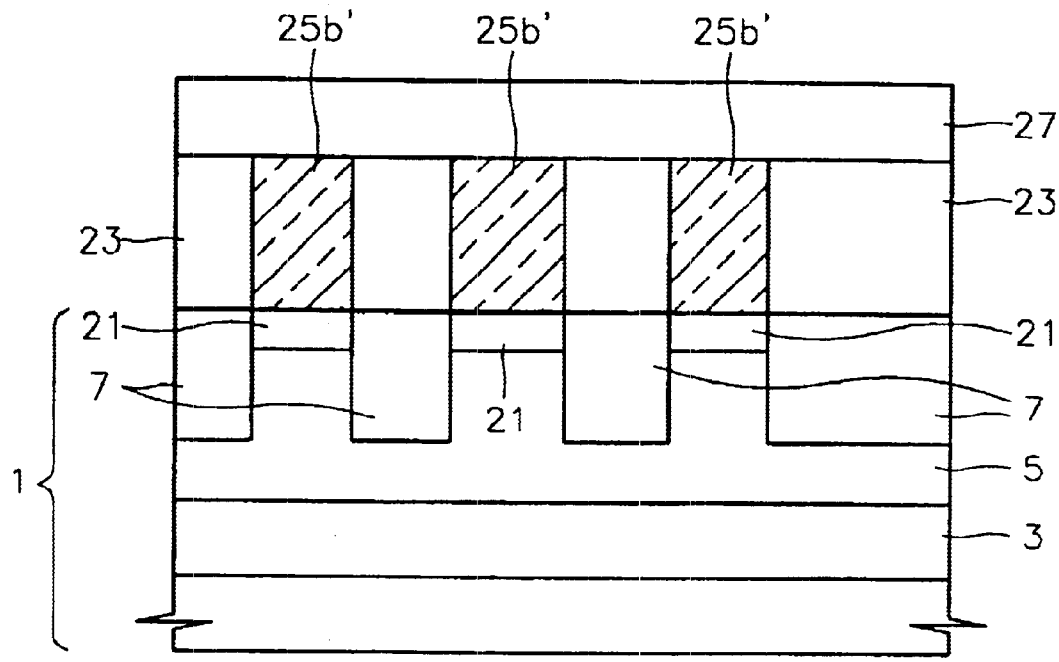
Figure 6D:
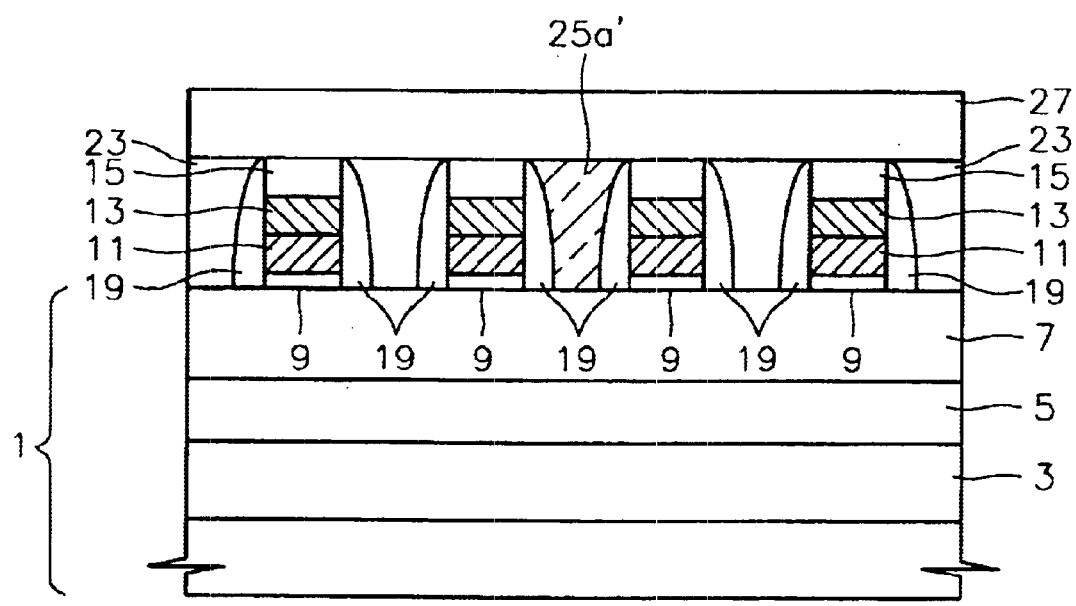
FIG. 6D is another example of a cross-section view shown in FIG. 6A, taken along C–C' direction.

FIG. 6A is a plan view illustrating the step of forming a pad layer and an interlayer dielectric film, FIGS. 6B and 6C are cross-sectional views of FIG. 6A, taken along 6B–6B' and 6C–6C' directions, and FIG. 6D is a cross-sectional view of FIG. 6A, taken along 6B–6B', according to another embodiment of the present invention.

In detail, a conductive material, e.g., a doped polysilicon layer, is deposited on the first insulating layer 23 having the first and second openings 25a and 25b which open the N-type impurity layer 21 in the active region of the semiconductor substrate 1 to a predetermined thickness, and then an etch-back or CMP process is performed to fill the openings 25a and 25b, thereby form a first pad layer 25a' and a second pad layer 25b'. As shown in FIG. 6A (specifically see the central portion of FIG. 6A), the first pad layer 25a' is a pad layer to be connected to a bit line to be formed during a subsequent step, and the second pad layer 25b' is a pad layer to be connected to a storage node contact of a capacitor to be formed during a subsequent step.

Here, as shown in FIG. 6D, the first and second openings 25a and 25b may be filled with conductive materials, and then an etch-back or CMP process may be continuously performed until the mask layer 15 of the gate electrode pattern 17 is exposed. At this time, the first pad layer 25a' and the second pad layer 25b' are spontaneously separated. Next, an insulating layer such as a BPSG layer is deposited over the resultant structure having the first and second pad layers 25a' and 25b' and then a CMP process is performed to form a first interlayer dielectric film 27 having a planar surface.

Figure 7A:
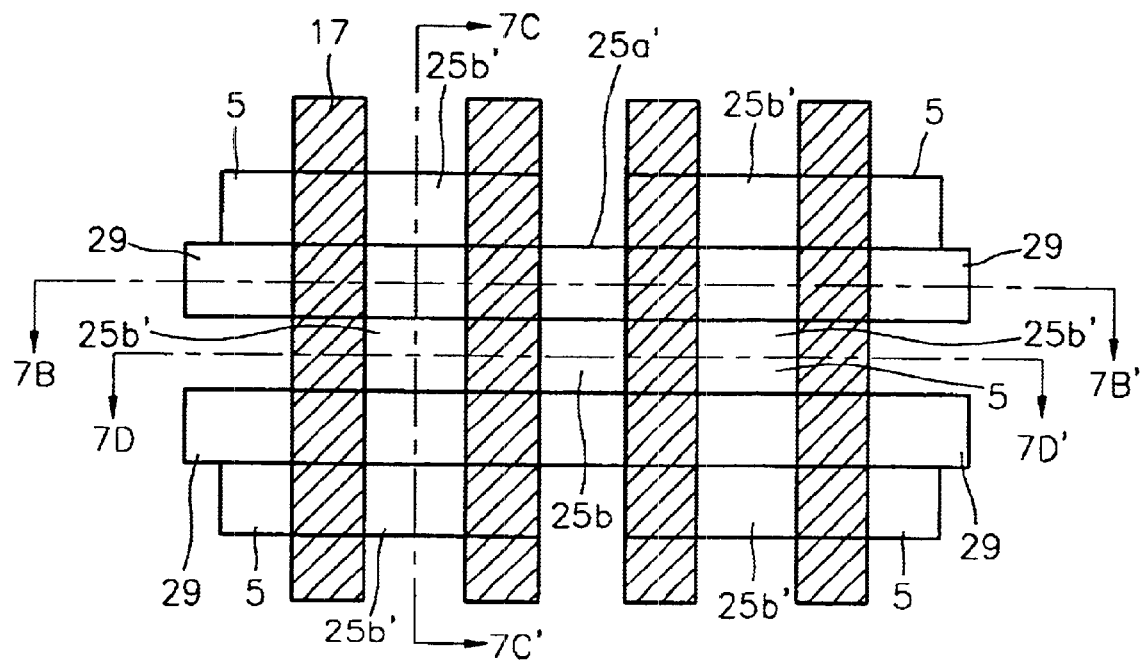
Figure 7B:
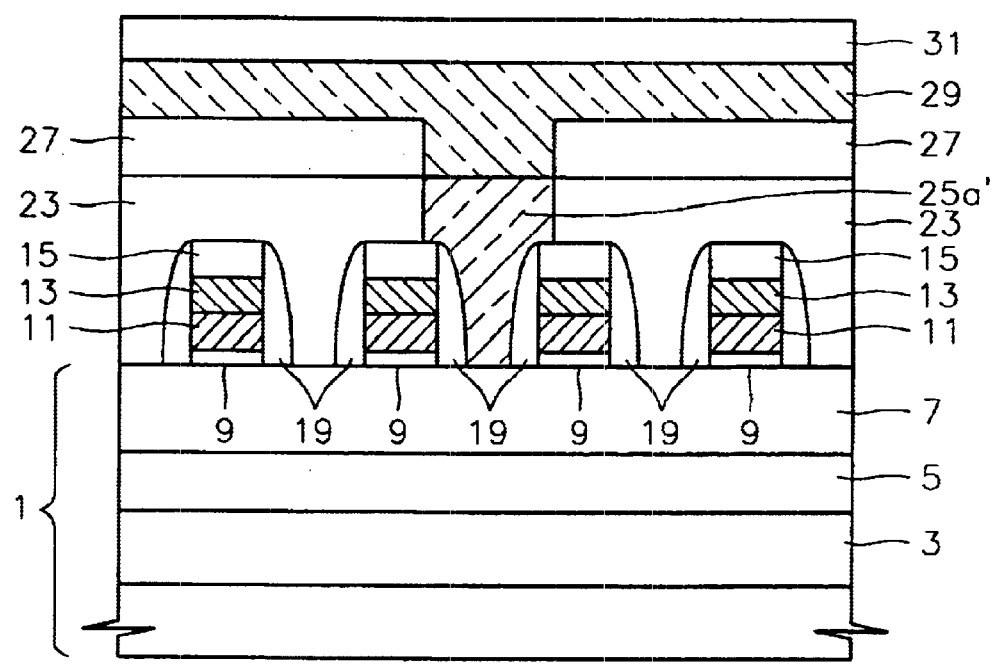
Figure 7C:
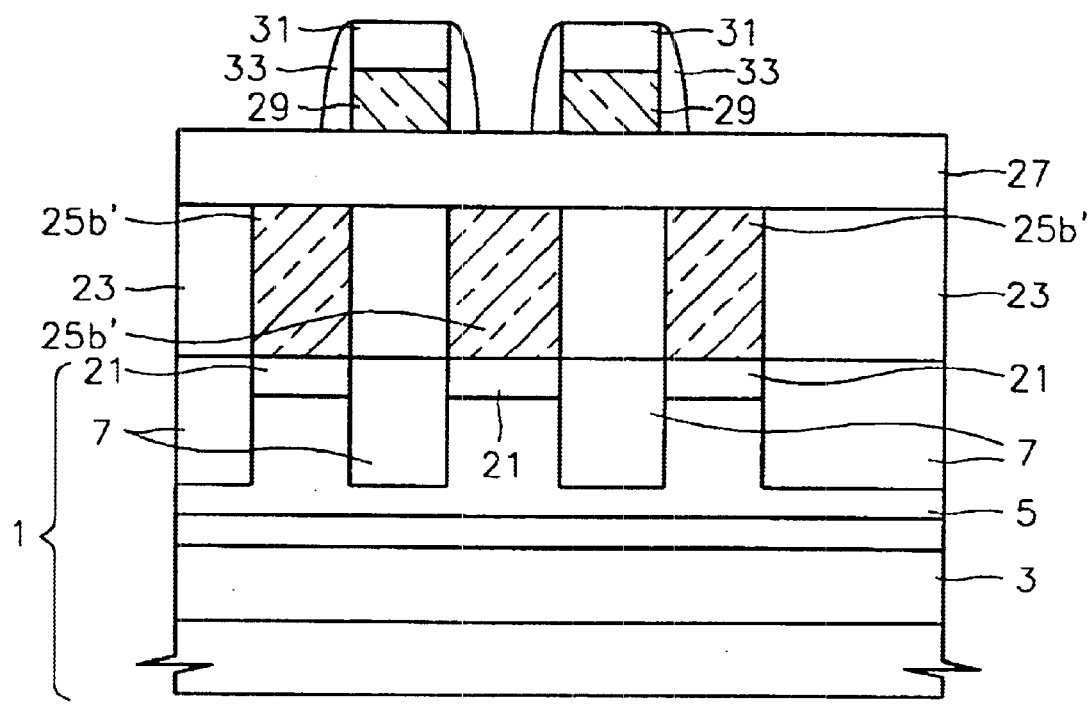
Figure 7D:
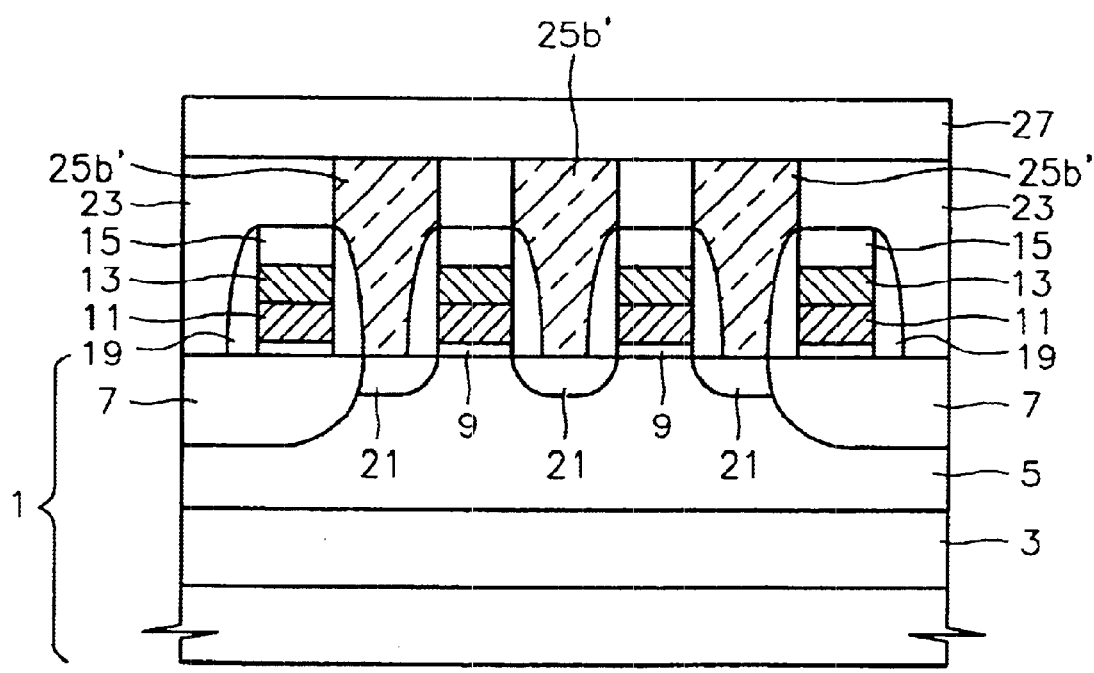

FIG. 7A is a plan view illustrating the step of forming a bit line, and FIGS. 7B, 7C and 7D are cross-sectional views of FIG. 7A, taken along 7B–7B', 7C–7C' and 7D–7D' directions.

In detail, a predetermined photolithography process is performed on the resultant structure having the first interlayer dielectric film 27 to form a third opening (corresponding to a portion where the bit line 29 and the first pad layer 25a' are connected, in FIG. 7B) configured to open the first pad layer 25a', using a photoresist pattern. Next, a conductive material, e.g., a tungsten layer, is deposited over the entire surface of the resultant structure having the third opening to a predetermined thickness to form a bit line layer 29. Then, a mask layer 31 made of silicon nitride and having a predetermined thickness is deposited over the bit line layer by a PECVD or thermal method, thereby forming a mask layer. Instead of tungsten used as the conductive layer for a bit line, titanium or a stacked layer of tungsten and titanium nitride may be used.

Next, a predetermined photolithography process is performed to define a region where a bit line is to be formed, and then the mask layer 31 and the bit line layer 29 are anisotropically etched in sequence, thereby forming a bit line pattern orthogonal to the word line shown in FIG. 7C. The bit line layer 29 is connected to the N-type impurity layer 21 in the active region of the semiconductor substrate 1 by the first pad layer 25a' self-aligned to the spacer 19 formed at the side walls of the gate electrode 11/13. FIG. 7B is a cross-sectional view taken along a portion where the first pad layer 25a' is formed on the isolation layer 7. Thus, it is not shown that the first pad layer 25a' is connected to the N-type impurity layer 21. However, as show in FIG. 5A, since the pattern of the first opening 25 filled with the first pad layer 25a' is formed on both the active region and the isolation region, it is appreciated that the N-type impurity layer 21 of the semiconductor substrate 1 and the first pad layer 25a' are electrically connected.

As shown in FIG. 7C, a silicon nitride layer is deposited on the entire surface of the resultant structure having the bit line pattern by a LPCVD method and then etched back to form an insulating spacer 33 at both side walls of the bit line pattern. The etch-back process is performed until the surface of the first interlayer dielectric film 27 is exposed.

Figure 8A:
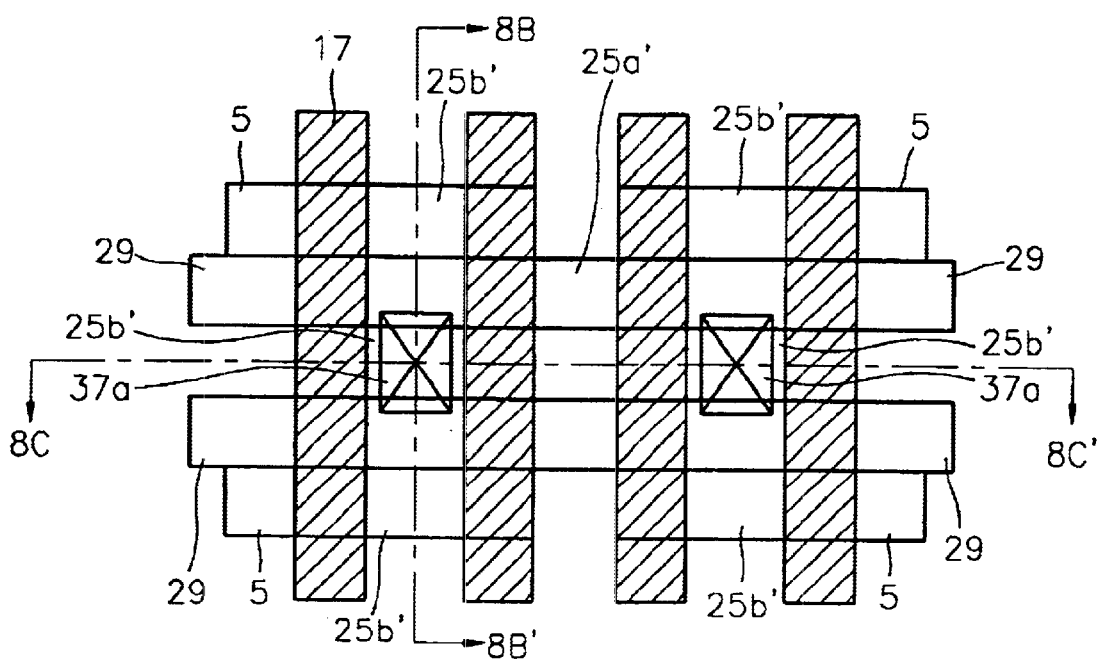
Figure 8B:
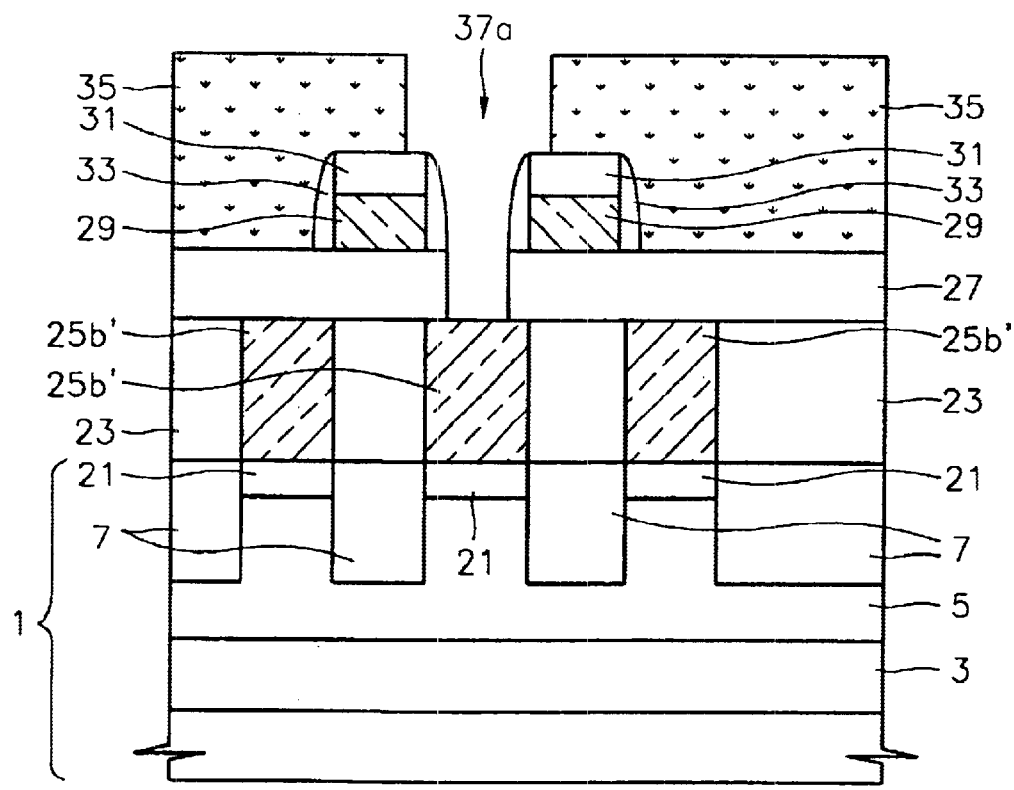
Figure 8C:
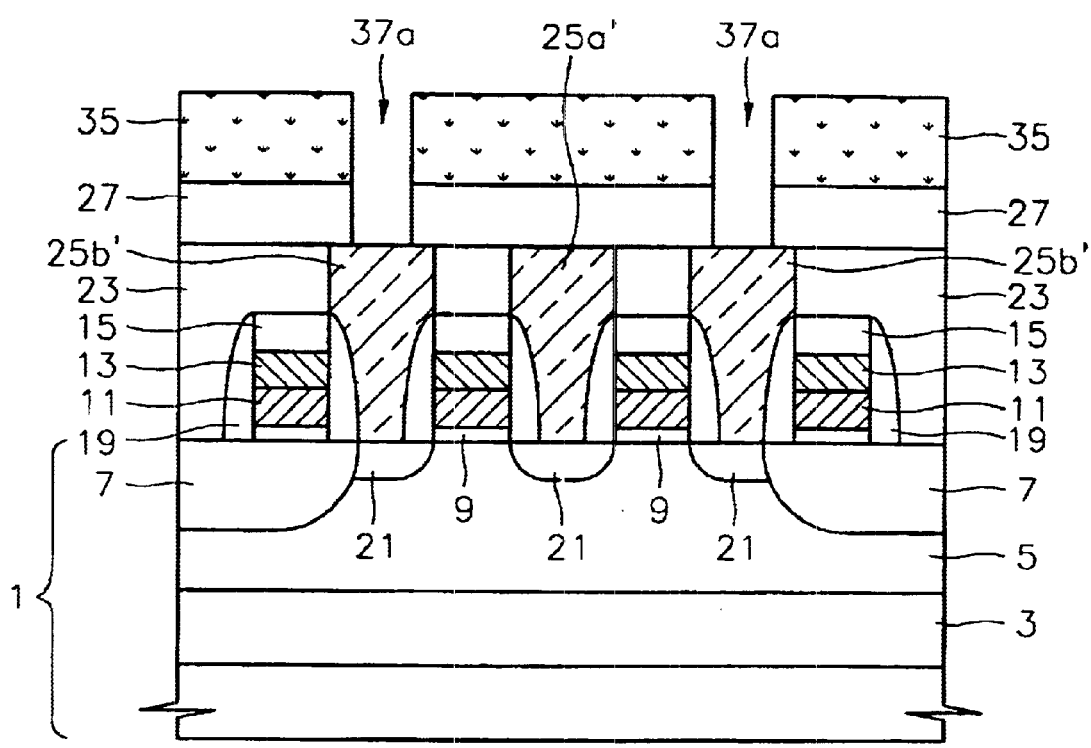

FIG. 8A is a plan view illustrating the step of forming a storage node contact in a self-aligned manner, and FIGS. 8B and 8C are cross-sectional views of FIG. 8A, taken along 8B–8B' and 8C–8C' directions.

In detail, after forming the insulating spacer 33 at side walls of the bit line pattern, an insulating layer, e.g., a silicon oxide layer, is deposited over the resultant structure to form a second interlayer dielectric film 35 which completely fills the gap between bit lines 29. Then, a photolithography process is performed to a photoresist pattern (not shown) configured to open the second interlayer dielectric film 35 over a source or drain region of the semiconductor substrate 1. The second and first interlayer dielectric films 35 and 27 are anisotropically etched in sequence using the photoresist pattern as an etching mask until the surface of the second pad layer 25b' is opened, thereby forming a fourth opening 37a for forming a storage node contact. Here, the fourth opening 37a is self-aligned to the spacer 33 formed at the side walls of the bit line patterns 29. The second and first interlayer dielectric films 35 and 27 which are silicon oxide layers have excellent etching selectivity with respect to silicon nitride forming the mask layer 31 and spacer 33, and are capable of being continuously subjected to etching. A mixed gas of $C_4F_8$, $O_2$ and Ar is used as an etching gas for the etching process for forming the fourth opening 37a.

Figure 9A:
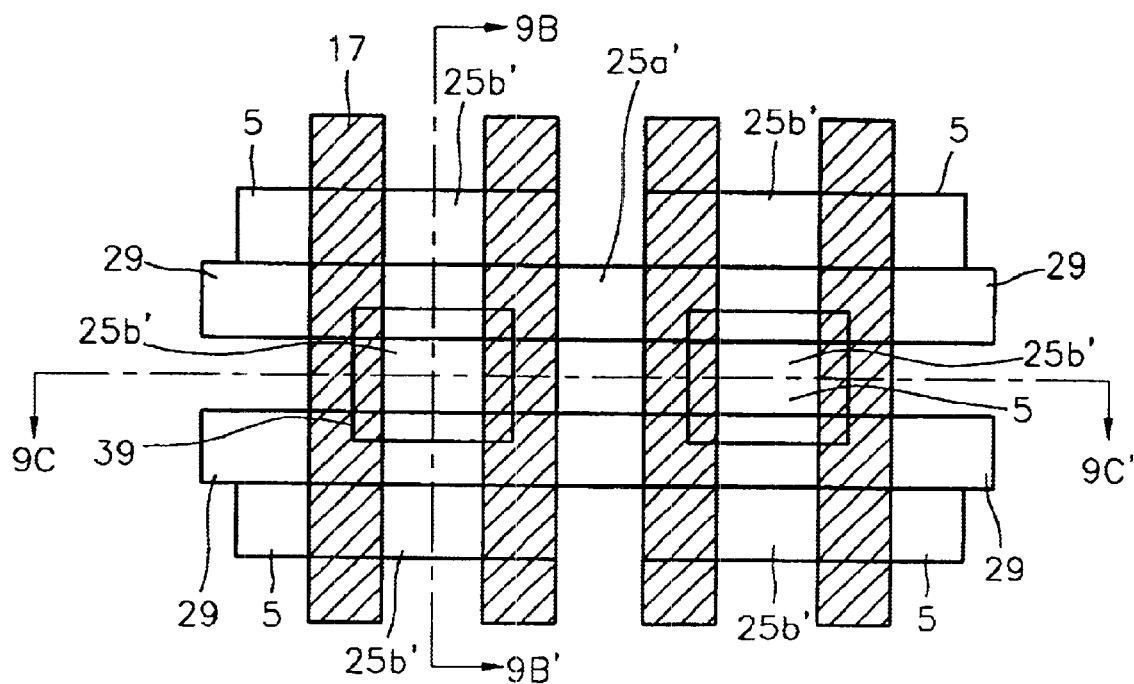
Figure 9B:
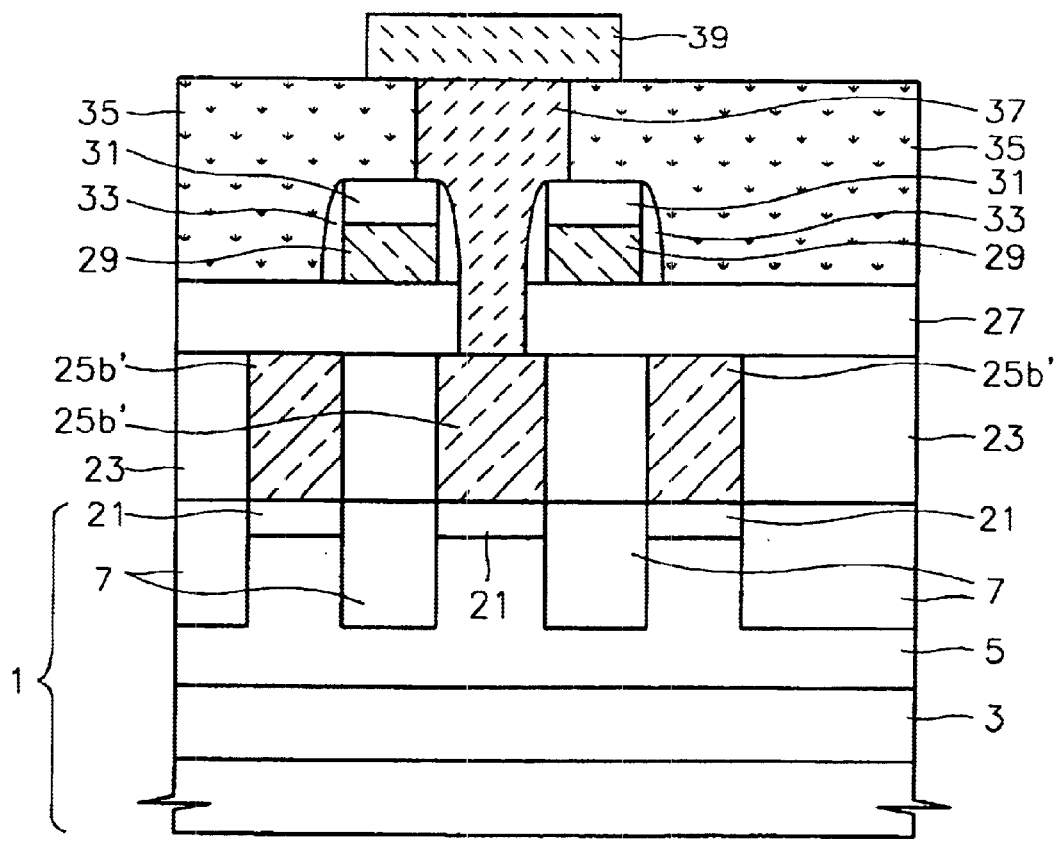
Figure 9C:
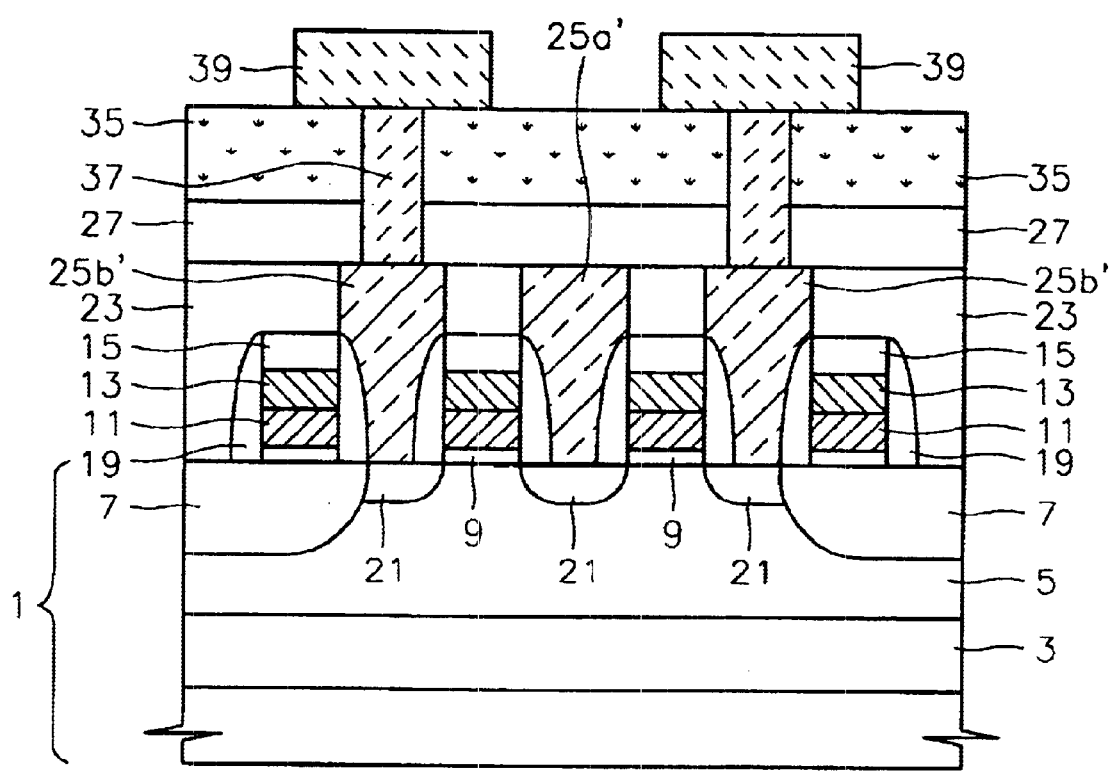

FIG. 9A is a plan view illustrating the step of forming a storage electrode, and FIGS. 9B and 9C are cross-sectional views of FIG. 9A, taken along 9B–9B' and 9C–9C' directions.

In detail, a conductive material, e.g., a doped polysilicon layer, is deposited over the resultant structure having the fourth opening 37a which opens the second pad layer 25b' and then etched back to form a storage node contact 37 which fills the fourth opening 37a. Then, a conductive material for a storage electrode, e.g., a doped polysilicon layer, is deposited over the entire surface of the resultant structure. A photoresist pattern (not shown) for defining a storage electrode is formed by a photolithography process and then the polysilicon layer is patterned using the photoresist pattern, thereby forming a storage electrode 39 connected to the storage node contact 37. Then, a dielectric layer (not shown) and a plate electrode (not shown) may be formed over the storage electrode 39 by a conventional method, thereby fabricating a semiconductor memory device according to a preferred embodiment of the present invention.

In this embodiment, the storage node contact 37 is formed and the storage electrode 39 is then formed separately from the storage node contact 37. However, while filling the fourth opening 37a, a conductive material may be formed on the second interlayer dielectric film 35 and may be patterned, thereby integrally forming the storage node contact 37 and the storage electrode 39.

In the above-described embodiment of the present invention, the storage electrode 39 has a simple, stacked structure. However, the storage electrode may have cylindrical or other shape to increase the cell capacitance.

As described above, according to the present invention, since a spacer is previously formed at side walls of a bit line pattern and an opening for a storage node contact is then formed to be self-aligned to the spacer, the gap between bit lines is wider than that in the conventional art. Thus, the gap-filling capability of an opening between bit lines can be greatly improved.

What is claimed is:

1. A method of fabricating a semiconductor memory device having a self-aligned contact, comprising the steps of:

forming a plurality of gate electrodes by interposing a gate insulating layer on an active region of a semiconductor substrate in a predetermined direction at constant intervals;

forming a first insulating layer on the resultant structure having the gate electrodes and then forming one or more of each of first and second openings in the first insulating layer to partially open an active region of the semiconductor substrate;

forming first and second pad layers by filling the first and second openings with a conductive material;

forming a first interlayer dielectric film on the first insulating layer having the first and second pad layers and forming a third opening which opens the surface of the first pad layer;

forming a plurality of bit lines in a direction orthogonal to the gate electrodes on the first interlayer dielectric film while filling the third opening;

depositing an insulating layer on the resultant structure having the bit lines and removing the insulating layer on the bit lines and on the first interlayer dielectric film to form insulating spacers only at both side walls of the bit lines;

forming a second interlayer dielectric film on the resultant structure having the insulating spacers and forming a fourth opening self-aligned to the insulating spacers and between adjacent bitlines to open the surface of the second pad layer; and filling the fourth opening with a conductive material to form a storage node contact of a capacitor; and forming a dielectric layer and a plate electrode above the filled-to-form storage node contact to complete the formation of the capacitor.

2. The method according to claim 1, wherein the step of forming the gate electrodes comprises the sub-steps of:

stacking a polysilicon layer, a silicide layer and a mask layer on the gate insulating layer; and patterning the mask layer, the silicide layer and the polysilicon layer.

3. The method according to claim 2, wherein the mask layer is formed of a silicon nitride (SiN) layer based on plasma enhanced chemical vapor deposition (PECVD) or a thermal SiN layer.

4. The method according to claim 1, wherein the step of forming the bit lines comprises the sub-steps of:

forming a conductive layer on the first interlayer dielectric film while filling the third opening;

forming a mask layer on the conductive layer; and sequentially patterning the mask layer and the conductive layer.

5. The method according to claim 1, wherein the bit line is formed of tungsten, titanium or a stacked layer of tungsten and titanium nitride.

6. The method according to claim 4, wherein the mask layer is formed of a silicon nitride (SiN) layer based on plasma enhanced chemical vapor deposition (PEC VD) or a thermal SiN layer.

7. The method according to claim 2, after the patterning step, further comprising the step of forming an insulating spacer at both side walls of the mask layer, the silicide layer and the polysilicon layer.

8. The method according to claim 1, wherein the spacer formed at both side walls of the bit line is formed of a SiN layer based on low pressure chemical vapor deposition (LPCVD).

9. The method according to claim 1, wherein the first and second interlayer dielectric films are formed of silicon oxide, and the insulating spacer formed at both side walls of the bit line are formed of silicon nitride.

10. The method according to claim 9, wherein the fourth opening is etched using a mixed gas of $C_4F_8$, $O_2$ and Ar as an etching gas.

* * * * *

UNITED STATES PATENT AND TRADEMARK OFFICE
CERTIFICATE OF CORRECTION

PATENT NO.    : 6,682,975 B2
DATED         : January 27, 2004
INVENTOR(S)   : Kim et al.

It is certified that error appears in the above-identified patent and that said Letters Patent is hereby corrected as shown below:

Column 3,
Line 55, ""B" "C" and "D"" should read -- "B," "C" and "D" --.

Column 10,
Line 17, "(PEC VD)" should read -- (PECVD) --.

Signed and Sealed this

Twenty-seventh Day of July, 2004

JON W. DUDAS
*Acting Director of the United States Patent and Trademark Office*